(12) United States Patent
Tazawa et al.

(10) Patent No.: US 9,735,544 B2
(45) Date of Patent: Aug. 15, 2017

(54) SURFACE EMITTING LASER ELEMENT

(71) Applicant: STANLEY ELECTRIC CO., LTD., Meguro-ku, Tokyo (JP)

(72) Inventors: Komei Tazawa, Kawasaki (JP); Ji-Hao Liang, Tachikawa (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/331,384

(22) Filed: Oct. 21, 2016

(65) Prior Publication Data
US 2017/0125978 A1  May 4, 2017

(30) Foreign Application Priority Data

Oct. 30, 2015 (JP) ................. 2015-213531

(51) Int. Cl.
*H01S 5/00* (2006.01)
*H01S 5/183* (2006.01)
*H01S 5/042* (2006.01)
*H01S 5/343* (2006.01)
*H01S 5/42* (2006.01)
*H01S 5/187* (2006.01)
*H01S 5/024* (2006.01)

(52) U.S. Cl.
CPC ......... *H01S 5/183* (2013.01); *H01S 5/02476* (2013.01); *H01S 5/0425* (2013.01); *H01S 5/187* (2013.01); *H01S 5/18394* (2013.01); *H01S 5/34333* (2013.01); *H01S 5/423* (2013.01); *H01S 5/18308* (2013.01)

(58) Field of Classification Search
CPC ...... H01S 5/183; H01S 5/18394; H01S 5/187; H01S 5/34333; H01S 5/423; H01S 5/02476; H01S 5/18308
See application file for complete search history.

(56) References Cited

U.S. PATENT DOCUMENTS

| 6,807,211 B1 * | 10/2004 | Cok ........................ H01S 5/36 372/39 |
| 2005/0230795 A1 * | 10/2005 | Furuyama ............ G02B 6/4201 257/678 |
| 2008/0232412 A1 * | 9/2008 | Mizuuchi .................. H01S 5/14 372/22 |

(Continued)

FOREIGN PATENT DOCUMENTS

JP  2015043109 A  3/2015

*Primary Examiner* — Kinam Park
(74) *Attorney, Agent, or Firm* — Holtz, Holtz & Volek PC

(57) ABSTRACT

A surface emitting laser element includes: a semiconductor structure layer interposed between a first multi-layer reflector and a second multi-layer reflector; an insulating current confinement layer that is formed on a semiconductor layer of a second conductivity type and includes a first through-hole with a transparent electrode; the second multi-layer reflector formed on the current confinement layer and the transparent electrode; a heat conducting layer that is formed on the second multi-layer reflector and includes a second through-hole disposed coaxially with the first through-hole in the current confinement layer and having a minimum opening diameter smaller than an opening diameter of the first through-hole; and an emission color converting portion that is formed above the second through-hole in the heat conducting layer and includes phosphor.

8 Claims, 6 Drawing Sheets

(56) References Cited

U.S. PATENT DOCUMENTS

2011/0261849 A1* 10/2011 Shinagawa ........... H01L 33/007
                                                    372/45.01
2016/0248224 A1*  8/2016 Noda ................... H01S 5/0425

* cited by examiner

SURFACE EMITTING LASER ELEMENT

BACKGROUND OF THE INVENTION

1. Field of the Invention

The present invention relates to a semiconductor light-emitting element such as a laser diode (LD), and more particularly, to a surface emitting laser element having an active layer sandwiched between resonator mirrors.

2. Description of the Related Art

As shown in FIG. 1, a module of a light source device for causing light from an excitation light source to be efficiently irradiated onto phosphor has been conventionally known. Excitation light from an excitation light source 131, which is a laser diode, is concentrated on an entrance port 136a of a mirror surface box 136 by a condensing lens 132. The excitation light then enters the mirror surface box 136 to excite phosphor 133. Of a bundle of rays having entered into the mirror surface box 136, a bundle of rays transmitted through the phosphor 133 is reflected by a dichroic filter 137 to irradiate the phosphor 133 again and thereby excite the phosphor 133. Furthermore, a bundle of rays reflected by the phosphor 133 in the bundle of rays having entered into the mirror surface box 136 is reflected by a reflector 139 attached to an inner surface of the mirror surface box 136 to irradiate the phosphor 133 again and thereby excite the phosphor 133. In this manner, the bundle of rays having entered into the mirror surface box 136 can be irradiated onto the phosphor 133 without waste. Thus, the use efficiency of emitted light from the excitation light source 131 can be improved (for example, Japanese Patent Application Laid-Open No. 2015-43109).

SUMMARY OF THE INVENTION

In the light source device having the conventional structure, the excitation light source, which is a laser diode, the condensing lens, and the mirror surface box are independently provided. Thus, miniaturization of the module is difficult to achieve. Moreover, no regard is given to heat dissipation in an emission color converting portion, i.e., phosphor in the light source device having the conventional structure.

It is an object of the present invention to provide a surface emitting laser element capable of miniaturization by integration of an emission color converting portion and an excitation light source.

A surface emitting laser element of the present invention includes:

a first multi-layer reflector formed on a substrate;

a semiconductor structure layer formed on the first multi-layer reflector, the semiconductor structure layer including a semiconductor layer of a first conductivity type, an active layer including a quantum well layer, and a semiconductor layer of a second conductivity type opposite to the first conductivity type;

an insulating current confinement layer formed on the semiconductor layer of the second conductivity type, the current confinement layer including a first through-hole;

a transparent electrode covering the first through-hole and being in contact with the semiconductor layer of the second conductivity type;

a second multi-layer reflector formed on the transparent electrode;

a heat conducting layer formed on the second multi-layer reflector, the heat conducting layer including a second through-hole disposed coaxially with the first through-hole of the current confinement layer and having a minimum opening diameter smaller than an opening diameter of the first through-hole; and an emission color converting portion formed above the second through-hole of the heat conducting layer, the emission color converting portion including phosphor.

DETAILED DESCRIPTION OF THE INVENTION

Figure 1:
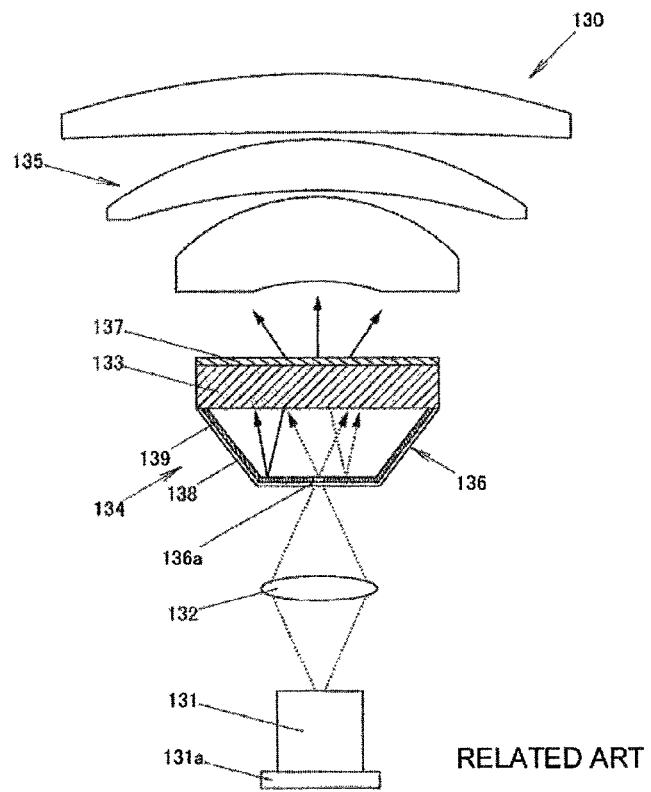
FIG. 1 is a cross-sectional view schematically illustrating a configuration of a light source device of a related art.

A vertical cavity surface emitting laser (VCSEL) element or device of the present invention, in particular, a surface emitting laser element having an active layer will be described with reference to the drawings. In the following description and the accompanying drawings, substantially the same or equivalent components will be denoted by the same reference numerals.

In a laser element, a region where a laser beam radius after the output of a Gaussian beam once becomes smaller in a homogeneous medium is generally referred to as a beam waist. In a Gaussian beam having a centrally symmetric intensity distribution, a position at which light intensity equals $1/e^2$ of the maximum value is referred to as a beam diameter (about 86.5% of total light intensity).

The present inventor arrived at the present invention by focusing on the beam waist immediately after radiation from a resonator in the surface emitting laser element, making researches and experiments on the possibility of control for the position of such a beam waist, and discovering a heat dissipation structure.

First Embodiment

Figure 2:
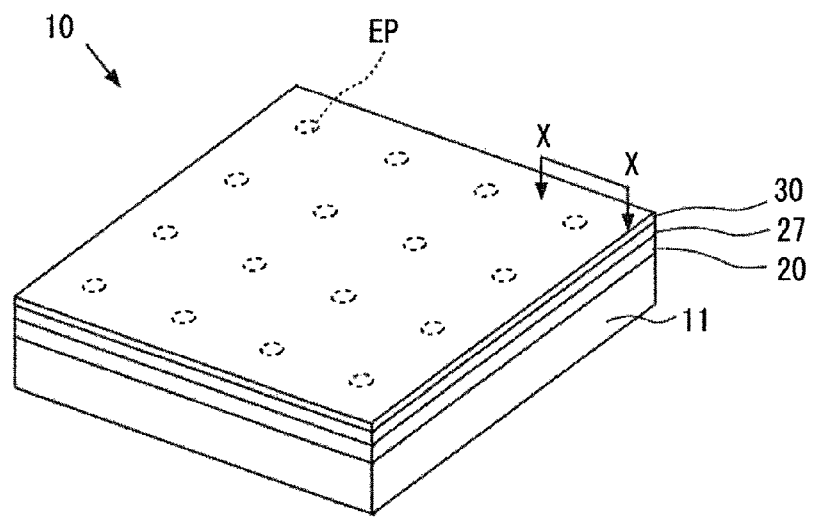
FIG. 2 is a general perspective view schematically illustrating a configuration of a surface emitting laser element (hereinafter, also simply referred to as a light-emitting element or element) according to a first embodiment of the present invention.

FIG. 2 is a general perspective view schematically illustrating a configuration of a surface emitting laser element or device 10 according to a first embodiment of the present invention. In this laser element 10, light-emitting portions, each including an exit port EP of a laser beam BM, are arranged in an array of 4×4, i.e., 16 light-emitting portions are arranged as shown in FIG. 2. The surface emitting laser element 10 includes a laser element portion (hereinafter, also simply referred to as an element portion) 20, a heat conducting layer 27, and an emission color converting portion including phosphor, i.e., a phosphor layer 30, which are formed on a substrate 11 in this order.

Figure 3:
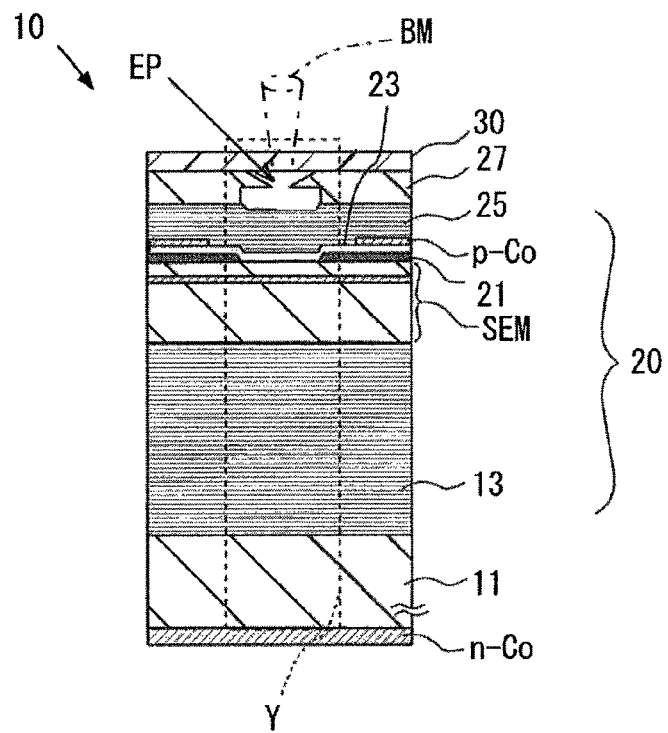
FIG. 3 is a partial cross-sectional view schematically illustrating part of the surface emitting laser element shown in FIG. 2 extending across the line X-X.

FIG. 3 is a partial cross-sectional view schematically illustrating part of the surface emitting laser element 10 shown in FIG. 2 extending across the line X-X.

In each of the light-emitting portions in the surface emitting laser element 10, the laser element portion 20 formed on the conductive substrate 11 made of, for example, GaN includes: a conductive first multi-layer reflector 13; a semiconductor structure layer SEM; an insulating current confinement layer 21; a transparent electrode 23; a p-contact layer p-Co; and a second multi-layer reflector 25 as shown in FIG. 3. The semiconductor structure layer SEM includes a GaN (gallium nitride)-based semiconductor. An opening of the heat conducting layer 27 formed directly above the transparent electrode 23 in the element portion 20 serves as the exit port EP of the laser beam BM. The laser beam BM thus passes through the phosphor layer 30.

Here, the p-contact layer p-Co that plays the roles of heat dissipation and wiring and the heat conducting layer 27 for heat dissipation are separated from each other by the second multi-layer reflector 25. This can increase flexibility in the wiring pattern of the p-contact layer p-Co. Note that an n-contact layer n-Co is formed on a surface of the substrate 11 opposite to the p-contact layer p-Co.

In the present embodiment, the first multi-layer reflector 13 and the second multi-layer reflector 25 are each formed as a distributed Bragg reflector (DBR).

Figure 4:
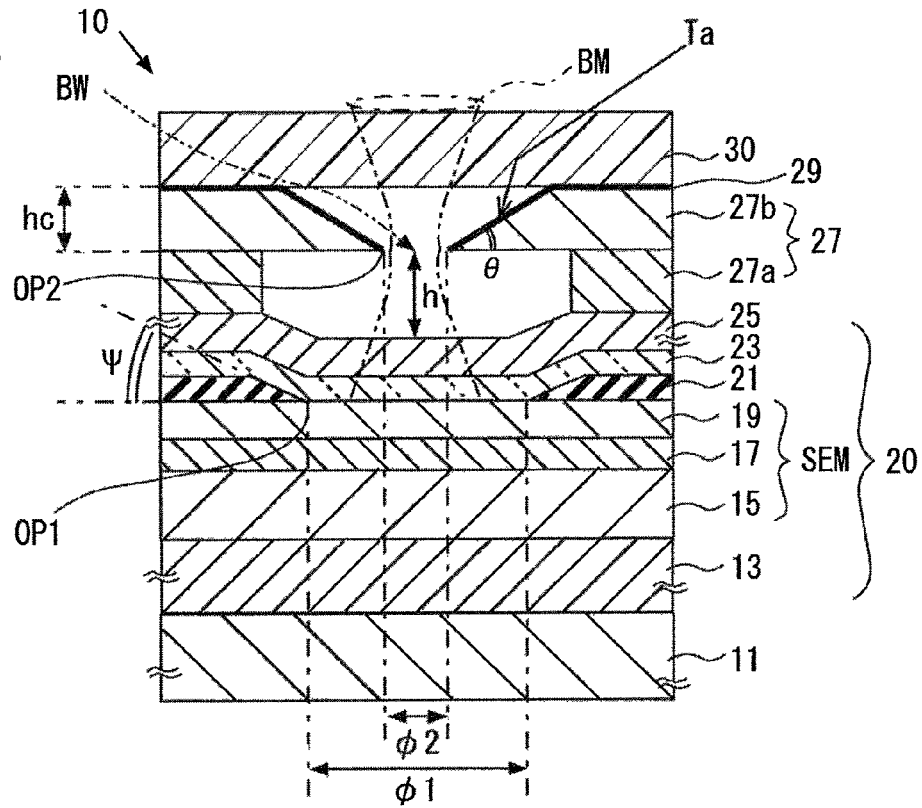
FIG. 4 is a partial cross-sectional view schematically illustrating part of the surface emitting laser element shown in FIG. 3 surrounded by the line Y.

FIG. 4 is a partial cross-sectional view schematically illustrating part of the surface emitting laser element 10 shown in FIG. 3 surrounded by the line Y.

The semiconductor structure layer SEM includes an n-type semiconductor layer 15, an active layer 17 including a quantum well layer, and a p-type semiconductor layer 19, which are formed on the first multi-layer reflector 13 in this order.

The insulating current confinement layer 21 is formed on the p-type semiconductor layer 19 and includes a first through-hole OP1.

The transparent electrode 23 is formed over the current confinement layer 21 and the p-type semiconductor layer 19 so as to cover the first through-hole OP1 and be in contact with the p-type semiconductor layer 19.

The second multi-layer reflector 25 formed on the transparent electrode 23 and the first multi-layer reflector 13 interpose the semiconductor structure layer SEM therebetween and thereby define a resonant structure.

The heat conducting layer 27 on the second multi-layer reflector 25 includes: a lower metal layer 27a, which is disposed closer to the second multi-layer reflector 25, having a uniform opening diameter; and an upper metal layer 27b having a taper-shape and defining an opening widened in a gradually-increasing shape. The phosphor layer 30 is formed on the upper metal layer 27b. The surface emitting laser element is designed to have an emission wavelength of 400 to 450 nm. For example, the first multi-layer reflector 13, which is a conductive mirror, includes 40 GaN/InAlN paired multi-layers and the second multi-layer reflector 25, which is a dielectric mirror, includes 8 $Nb_2O_5/SiO_2$ paired multi-layers.

The lower metal layer 27a is preferably formed on the second multi-layer reflector 25 by plating, for example, using a metal such as Cu. In the upper metal layer 27b, the opening portion having a predetermined cross-sectional shape (for example, a taper shape T) is formed in a plate-shaped Al or Si, for example, by etching, for example. A highly reflective coating made of Ag, for example, i.e., a reflective film 29 is formed on the surface of the opening portion. The upper metal layer 27b is bonded on the lower metal layer 27a. Note that a dielectric protective layer made of $SiO_2$ or $Al_2O_3$, for example, may be formed on the upper metal layer 27b after the application of the highly reflective coating. Alternatively, the heat conducting layer 27 may be made of a material having high heat conductivity such as graphite or diamond-like carbon (DLC).

The heat conducting layer 27 includes a minimum opening diameter portion of a second through-hole OP2, which is disposed coaxially with the first through-hole OP1 of the current confinement layer 21 and has a minimum opening diameter $\phi 2$ smaller than an opening diameter or a minimum opening diameter $\phi 1$ of the first through-hole OP1. The minimum opening diameter $\phi 2$ of the second through-hole OP2 in the heat conducting layer 27 can be set equal to the diameter of a beam waist BW of the outgoing laser beam BM.

The minimum opening diameter portion of the second through-hole OP2 in the heat conducting layer 27 is positioned at the beam waist BW of the outgoing laser beam BM. The diameter of the laser beam BM becomes larger than the minimum opening diameter portion of the second through-hole OP2 when transmitting through a surface of the phosphor layer 30.

Note that the reflective film 29 is formed on a surface of the second through-hole OP2 in the heat conducting layer 27 extending from the minimum opening diameter portion to an opening edge adjacent to the phosphor layer 30.

The opening diameter of the lower metal layer 27a in the space of a laser exit surface is equal to or larger than the emission diameter of the laser element portion 20. The opening diameter of the upper metal layer 27b may not uniform and has the smallest value in the minimum opening diameter corresponding to the position of the beam waist BW. Since the minimum opening diameter of the heat conducting layer 27 can be made equal to the diameter of the beam waist BW as described above, returning light reflected by the phosphor layer 30 can be reduced.

The phosphor layer 30 preferably has a plate shape. Typically in a method combining a blue LD and phosphor, the phosphor is irradiated with light of the blue LD to emit white light. Thus, the phosphor layer 30 in which yellow phosphor is dispersed in a binder or the phosphor layer 30 in which red phosphor and green phosphor are dispersed in a binder, for example, is used for the element portion 20 of the blue LD. Mixing three colors of blue light (blue LD), red light (red phosphor), and green light (green phosphor), rather than mixing blue light (blue LD) and complementary yellow light (yellow phosphor), increases red and green components in light. Thus, more natural white light can be obtained.

Moreover, a beam waist position "h" (i.e., a distance from a surface of the second multi-layer reflector 25) can be controlled by changing a taper angle $\psi$ of $SiO_2$, which is the current confinement layer 21. Heat dissipation effect can be enhanced by adjusting the beam waist position h to increase the thickness of the lower metal layer 27a.

As shown in FIG. 4, by setting a taper angle $\theta$ of the opening portion of the upper metal layer 27b in conformity with the outgoing beam divergence of the laser element portion 20, the phosphor layer 30 can be efficiently irradiated with the outgoing light of the emitting laser without the outgoing light being blocked in the opening of the upper metal layer 27b.

Figure 5:
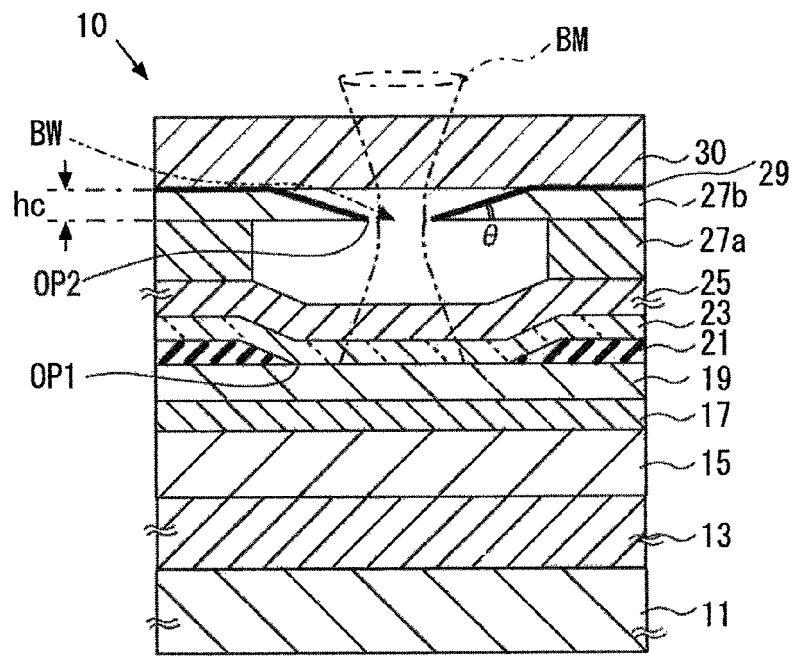
FIG. 5 is a general cross-sectional view schematically illustrating part of a configuration of a surface emitting laser element according to a modification of the first embodiment of the present invention.
Figure 6:
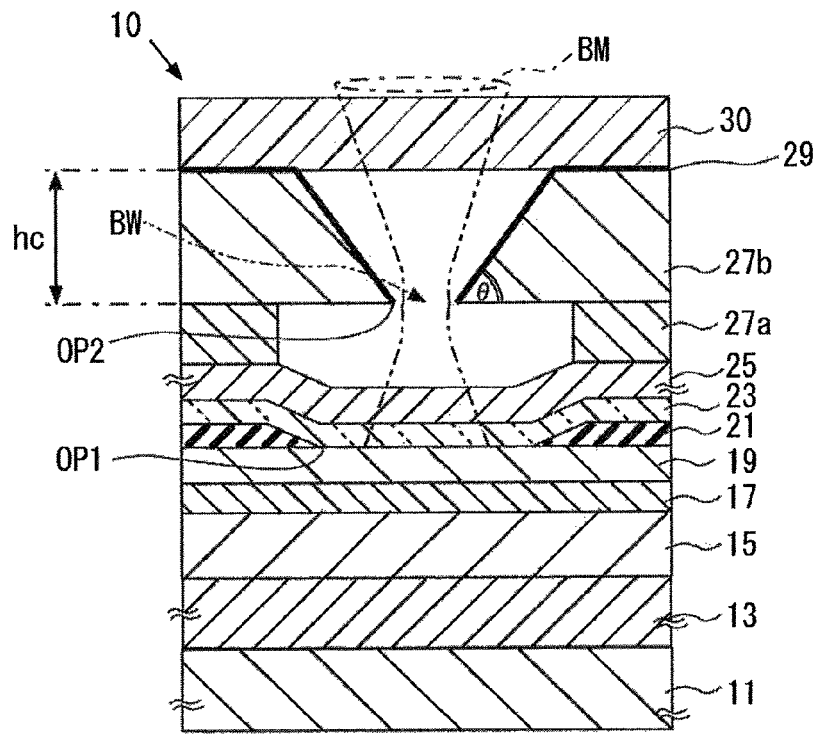
FIG. 6 is a general cross-sectional view schematically illustrating part of a configuration of a surface emitting laser element according to another modification of the first embodiment of the present invention.

As in modifications shown in FIGS. 5 and 6, a thickness "hc" of the upper metal layer 27b can be controlled by the taper angle $\theta$ of the upper metal layer 27b. As the value of $\theta$ increases, the thickness hc increases and thus the heat dissipation effect improves. Furthermore, since the thickness hc is a distance between the phosphor layer 30, which is a reflecting surface, and an entrance opening of the upper metal layer 27b, a larger thickness hc yields a greater effect of reducing returning light.

As described above, heat generation in very small portions of the laser element portion 20 and the phosphor layer 30 can be diffused laterally from the heat conducting layer 27 in the present embodiment. This improves heat dissipation efficiency in the light-emitting portion of the laser element and the phosphor layer 30. According to the present embodiment, the arrayed (for example, 4×4) laser element structure is continuous in terms of semiconductor, and the metal layers are also continuously provided. Thus, a great heat dissipation effect can be expected as compared to the case of a single laser element. Moreover, the structure of the present embodiment greatly contributes to higher output power without loss of output in a single laser element as a result of the reduction in returning light. Miniaturization can be achieved by integrating the emission color converting portion and the surface emitting laser element (that is, no condensing lens is required). Light loss can be reduced by the reduction in returning light from the phosphor layer 30. Such a surface emitting laser element can thus be expected to be applied to automobile headlights or general lighting.

Second Embodiment

Figure 7:
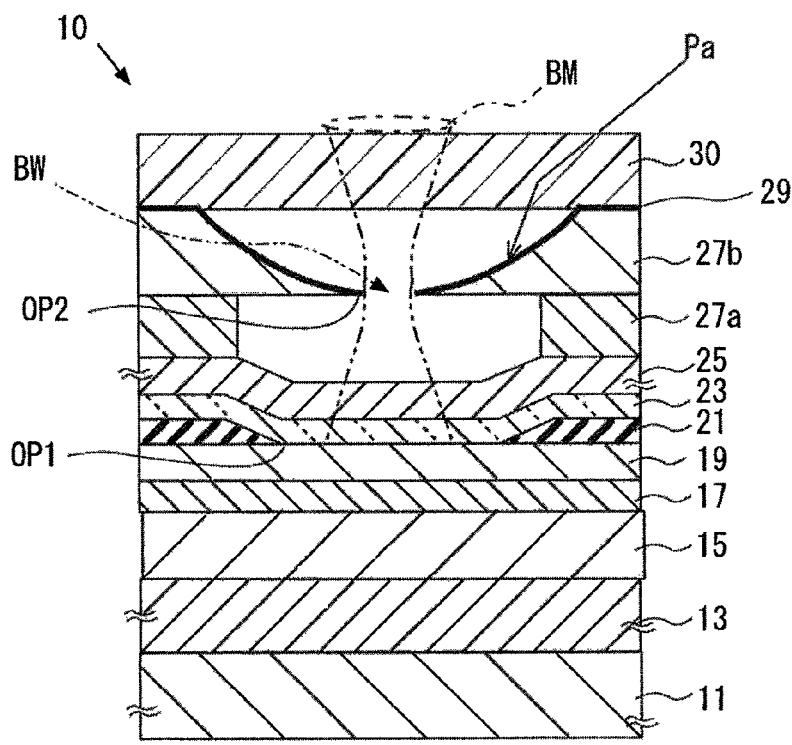
FIG. 7 is a general cross-sectional view schematically illustrating part of a configuration of a surface emitting laser element according to a second embodiment of the present invention.

FIG. 7 is a general cross-sectional view schematically illustrating part of a configuration of a surface emitting laser element according 10 to a second embodiment of the present invention.

The surface emitting laser element of the second embodiment has the same or equivalent components as those in the first embodiment except that an opening in an upper metal layer 27b in the second embodiment has a predetermined cross-sectional shape different from the cross-sectional shape of the first embodiment. The same components are denoted by the same reference numerals and descriptions on the configuration and function of the same or equivalent components will be omitted.

The surface emitting laser element of the second embodiment shown in FIG. 7 includes: a lower metal layer 27a having a uniform opening diameter; and the upper metal layer 27b including an entrance opening smaller than an emission diameter of the laser element portion 20 and an exit opening widened in a paraboloidal shape Pa from the entrance opening. In other words, a paraboloidal mirror is formed in the opening of the upper metal layer 27b.

Figure 8:
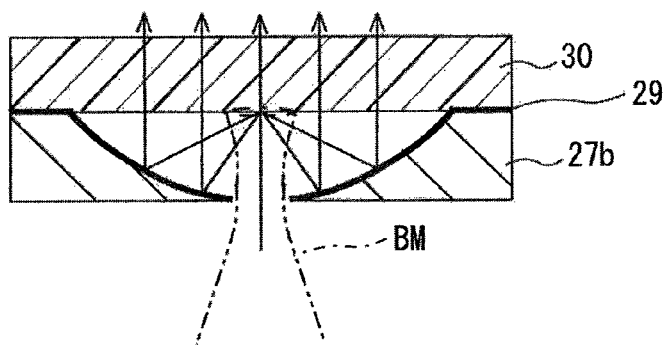
FIG. 8 is a partial cross-sectional view schematically illustrating part of the surface emitting laser element shown in FIG. 7.

As shown in FIG. 8, components reflected by a phosphor layer 30 (i.e., returning light indicated by arrows) are reflected by the paraboloidal mirror Pa to be components vertical to the phosphor layer 30. Thus, such returning light can efficiently enter the phosphor layer 30 again. In this case, the paraboloidal surface Pa is formed so that the focal points of the paraboloid surface are positioned on a beam entrance surface of the phosphor layer 30.

Figure 9:
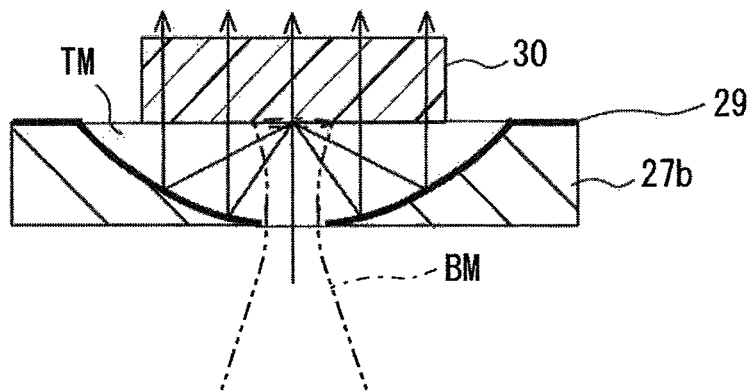
FIG. 9 is a general cross-sectional view schematically illustrating part of a configuration of a surface emitting laser element according to a modification of the second embodiment of the present invention.

In this case, a transparent material TM such as glass may be filled into the opening of the upper metal layer 27b and the area of the phosphor layer 30 may be set sufficiently smaller than an open edge of the paraboloidal mirror Pa as shown in FIG. 9. This allows the narrow-angle light distribution of white light. Note that single crystal may be used for the phosphor layer 30. Although diagrammatic illustration is omitted, a transparent material such as glass may be filled into the opening of the lower metal layer 27a in addition to the opening of the upper metal layer 27b.

Third Embodiment

Figure 10:
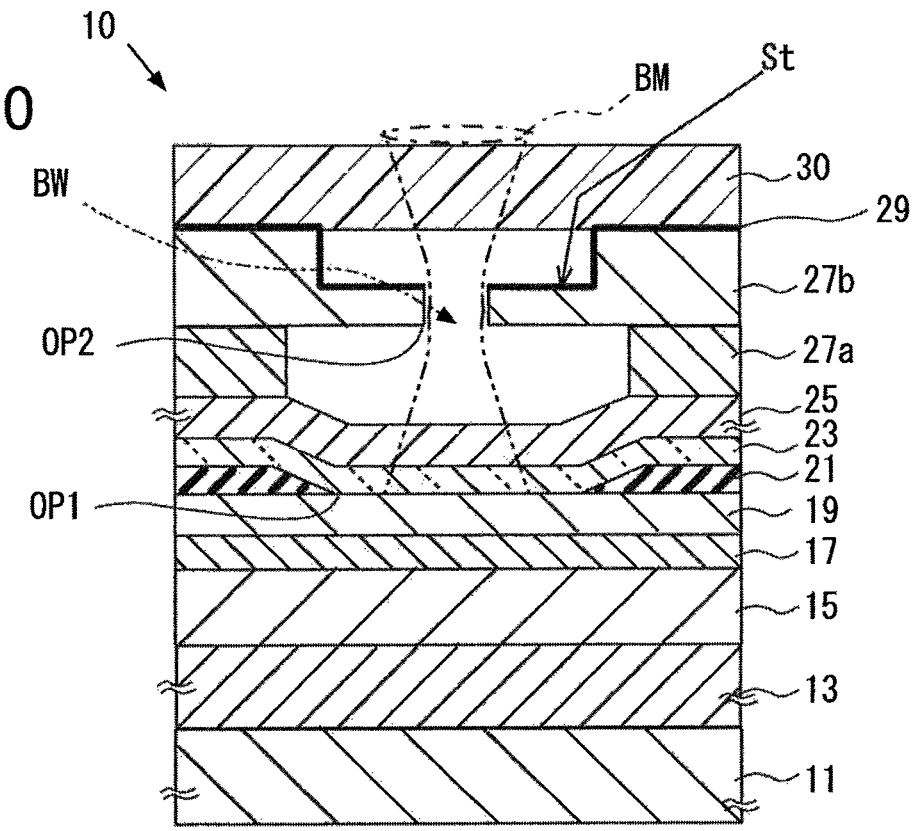
FIG. 10 is a general cross-sectional view schematically illustrating part of a configuration of a surface emitting laser element according to a third embodiment of the present invention.

FIG. 10 is a general cross-sectional view schematically illustrating part of a configuration of a surface emitting laser element 10 according to a third embodiment of the present invention.

The surface emitting laser element of the third embodiment has the same components as those in the first embodiment except that an opening in an upper metal layer 27b in the third embodiment has a predetermined cross-sectional shape different from the cross-sectional shape of the first embodiment. The same components are denoted by the same reference numerals and descriptions on the configuration and function of the same components will be omitted.

The surface emitting laser element of the third embodiment shown in FIG. 10 includes: a lower metal layer 27a having a uniform opening diameter; and the upper metal layer 27b including an entrance opening smaller than an exit port diameter of the laser element portion 20 and an exit opening widened in a stepped shape St from the entrance opening. In other words, a stepped mirror is formed in the opening of the upper metal layer 27b.

Fourth Embodiment

Figure 11:
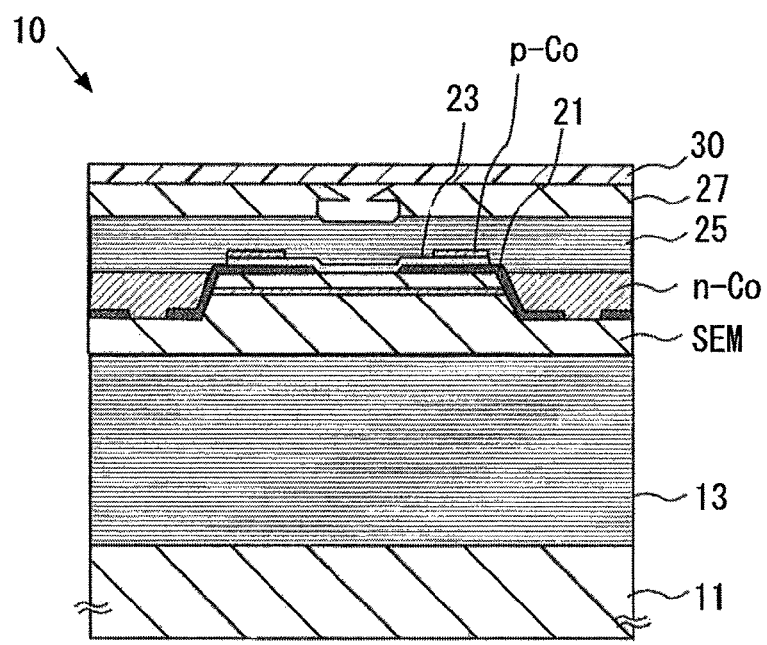
FIG. 11 is a general cross-sectional view schematically illustrating part of a configuration of a surface emitting laser element according to a fourth embodiment of the present invention.

FIG. 11 is a general cross-sectional view schematically illustrating part of a configuration of a surface emitting laser element 10 according to a fourth embodiment of the present invention.

The surface emitting laser element of the fourth embodiment has the same components as those in the first embodiment except that a mesa structure is formed in a semiconductor structure layer SEM; an opening of a current confinement layer 21, a transparent electrode 23, and a p-contact layer p-Co are disposed on an upper surface of the mesa structure; and an n-contact layer n-Co is disposed around the mesa structure so that the n-contact layer n-Co is disposed at a position different from that (i.e., on the surface of the substrate 11 opposite to the p-contact layer p-Co) in the surface emitting laser element of the first embodiment.

The same components are denoted by the same reference numerals and descriptions on the configuration and function of the same components will be omitted.

In the surface emitting laser element of the fourth embodiment, the n-contact layer n-Co is provided so as to be directly connected to an n-type semiconductor layer 15 of the semiconductor structure layer SEM. This enables carrier electron injection without the intervention of a first multi-layer reflector 13. Thus, improvement in injection efficiency can be expected. In this case, the first multi-layer reflector 13 may be a dielectric multi-layer film.

Fifth Embodiment

Figure 12:
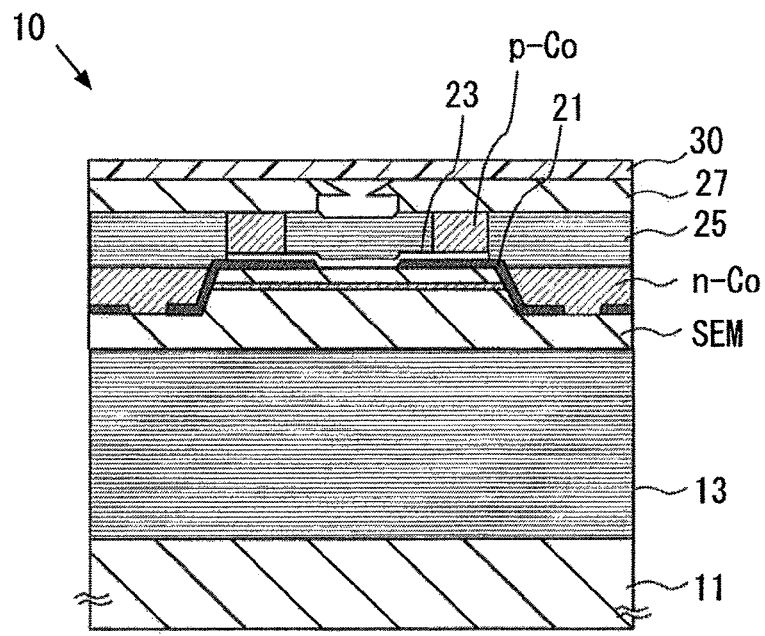
FIG. 12 is a general cross-sectional view schematically illustrating part of a configuration of a surface emitting laser element according to a fifth embodiment of the present invention.

FIG. 12 is a general cross-sectional view schematically illustrating part of a configuration of a surface emitting laser element 10 according to a fifth embodiment of the present invention.

The surface emitting laser element of the fifth embodiment has the same components as those in the fourth embodiment except that a p-contact layer p-Co in the fifth embodiment has a configuration different from that in the surface emitting laser element of the fourth embodiment. The same components are denoted by the same reference numerals and descriptions on the configuration and function of the same components will be omitted.

In the surface emitting laser element of the fifth embodiment, the p-contact layer p-Co is provided so as to be directly connected to a heat conducting layer 27. As a result of this, further improvement in heat dissipation property via the p-contact layer p-Co can be expected. Whether or not the p-contact layer p-Co and the heat conducting layer 27 are insulated from each other is appropriately determined depending on whether the arrayed element driving scheme is parallel driving or individual driving. In the laser element configuration shown in FIG. 12, an electrode configuration similar to that in FIG. 11 can be obtained, for example, by bonding the heat conducting layer 27 with an insulating film formed beforehand on a bonded surface with the p-contact layer p-Co. In this manner, the driving scheme can be controlled in accordance with its use even after the completion of the manufacturing process of the laser element portion 20.

In any of the above embodiments of the present invention, the active layer 17 may be an active layer having a multiple quantum well (MQW) structure. Although the semiconductor structure layer SEM includes the GaN (gallium nitride)-based semiconductor in the above embodiments, the crystal system is not limited thereto. The above-described embodiments may be appropriately modified and combined with one another.

This application is based on a Japanese Patent Application No. 2015-213531 which is hereby incorporated by reference.

What is claimed is:

1. A surface emitting laser element comprising:
   a first multi-layer reflector formed on a substrate;
   a semiconductor structure layer formed on the first multi-layer reflector, the semiconductor structure layer including a semiconductor layer of a first conductivity type, an active layer including a quantum well layer, and a semiconductor layer of a second conductivity type opposite to the first conductivity type;
   an insulating current confinement layer formed on the semiconductor layer of the second conductivity type, the current confinement layer including a first through-hole;
   a transparent electrode covering the first through-hole and being in contact with the semiconductor layer of the second conductivity type;
   a second multi-layer reflector formed on the transparent electrode;
   a heat conducting layer formed on the second multi-layer reflector, the heat conducting layer including a second through-hole disposed coaxially with the first through-hole of the current confinement layer and having a minimum opening diameter smaller than an opening diameter of the first through-hole; and
   an emission color converting portion formed above the second through-hole of the heat conducting layer, the emission color converting portion including phosphor.

2. The surface emitting laser element according to claim 1, wherein the heat conducting layer is made of a material selected from the group consisting of a metal, graphite, and diamond-like carbon (DLC).

3. The surface emitting laser element according to claim 1, wherein a portion of the minimum opening diameter in the second through-hole of the heat conducting layer is positioned at a beam waist of an outgoing laser beam.

4. The surface emitting laser element according to claim 3, comprising a reflective film formed on a surface of the second through-hole in the heat conducting layer, extending from the portion of the minimum opening diameter to an opening edge on a side of the emission color converting portion.

5. The surface emitting laser element according to claim 3, wherein a surface of the second through-hole in the heat conducting layer extending from the portion of the minimum opening diameter to an opening edge on a side of the emission color converting portion is formed to be widened in any shape selected from the group consisting of a stepped shape, a gradually-increasing shape, a curved shape, and a paraboloidal shape.

6. The surface emitting laser element according to claim 3, wherein the minimum opening diameter of the second through-hole in the heat conducting layer is equal to a beam waist diameter of the outgoing laser beam.

7. The surface emitting laser element according to claim 5, wherein
   the surface of the second through-hole in the heat conducting layer is formed in the paraboloidal shape, and has a focal point that is positioned on a surface of the emission color converting portion.

8. A surface-emitting-laser array comprising:
   a plurality of the surface emitting laser elements according to claim 1 arranged in an array on the substrate.

* * * * *